ID Patent [19]

Cherdron et al.

[11]  4,308,088
[45]  Dec. 29, 1981

[54] MACROCRYSTALLINE ALUMINUM OXIDE AND METHOD FOR ITS MANUFACTURE

[75] Inventors: Egon Cherdron, Limburgerhof; Heinz Hellinghausen, Ludwigshafen am Rhein; Alois Kramer, Hassloch; Horst Pohland, Limburgerhof, all of Fed. Rep. of Germany; Avraham Metzer, Haifa, Israel

[73] Assignee: Giulini Chemi GmbH, Ludwigshafen am Rhein, Fed. Rep. of Germany

[21] Appl. No.: 95,490

[22] Filed: Nov. 19, 1979

[30] Foreign Application Priority Data

Nov. 18, 1978 [DE] Fed. Rep. of Germany ....... 2850064

[51] Int. Cl.³ .............................................. C01B 1/02
[52] U.S. Cl. ..................................... 156/603; 51/309; 425/625
[58] Field of Search ................. 51/309; 156/DIG. 61, 156/603; 23/305 A; 423/625

[56] References Cited

U.S. PATENT DOCUMENTS

| 2,538,959 | 1/1951 | Ballard | 423/625 |
| 3,011,870 | 12/1961 | Webb et al. | 23/305 A |
| 3,121,623 | 2/1964 | Nesin | 156/DIG. 61 |
| 3,175,883 | 3/1965 | Lindsay | 423/133 |
| 3,718,494 | 2/1973 | Jacobson | 423/625 |
| 4,019,914 | 4/1977 | Esper | 423/625 |
| 4,130,402 | 12/1978 | Schepers et al. | 51/309 A |

FOREIGN PATENT DOCUMENTS

| 1092457 | 11/1960 | Fed. Rep. of Germany | 423/625 |
| 1767511 | 4/1977 | Fed. Rep. of Germany | |
| 36-381353 | 2/1961 | Japan | 423/625 |

Primary Examiner—Hiram Bernstein
Attorney, Agent, or Firm—Spencer & Kaye

[57]  ABSTRACT

A method for producing hexagonal, laminar, alpha aluminum oxide monocrystals having a grain size of about 16 to about 250 microns, and a diameter to thickness ratio of about 3:1 to about 7:1. Aluminum hydroxide of particle size greater than 60 microns is calcined in the presence of a fluorine-containing mineralizer at a temperature of greater than 1200° C. but no more than 1450° C., and the desired grain size is separated from the calcinate.

16 Claims, No Drawings

MACROCRYSTALLINE ALUMINUM OXIDE AND METHOD FOR ITS MANUFACTURE

BACKGROUND OF THE INVENTION

The present invention relates to a macrocrystalline, laminar aluminum oxide, hereinafter called alumina or corundum, as well as to a method for manufacturing it from aluminum hydroxide (hydrargillite).

Macrocrystalline aluminum oxide is known and is presently obtained either from electrocorundum or from sinter alumina (tabular alumina). For the manufacture of lapping, grinding or polishing agents, calcined alumina or bauxite is initially fused in electrical resistance furnaces to produce electrocorundum which, after solidification, is brought to the desired grain size by breaking, grinding, sifting, possibly sorting and washing. Problems and difficulties in this process arise as a result of the hardness of the material to be ground and in setting the desired grain size and shape.

Tabular alumina is highly pure aluminum oxide and is largely produced by sintering calcined alumina at temperatures between 1800° and 1950° C. By comminution, particularly grinding of the sintered pellets, a mixture of monocrystals is obtained, and this mixture is then fractionated into the desired grain size ranges. Due to its good heat conductivity, temperature shock resistance and extraordinary mechanical hardness values, tabular alumina is especially suitable as a raw material for high quality fireproof products and other ceramic products.

The aluminum oxide required as a starting product for the above-described aluminas is obtained by the known calcination of aluminum hydroxide from the Bayer process in a rotary drum furnace or in a fluidized bed furnace at temperatures above 1200° C.

Powdered aluminum oxide produced in this manner consists of agglomerates which are composed of a plurality of monocrystals, the particle size of the agglomerates lying between 10 and 300μ. When the agglomerates are ground, primary crystals are obtained whose average particle size, in dependence on the calcination method employed, is a maximum of 25μ. The primary crystals usually have a particle size of about 3 to about 12μ.

According to the process disclosed in U.S. Pat. No. 4,130,402 to Schepers et al, primary crystals of aluminum oxide of an average particle size in particular, up to 16μ, and a maximum average particle size up to about 25μ, can be produced by the calcination of aluminum hydroxide in the presence of at least one fluorine salt and one vanadium salt. The term "vanadium salt" is understood to mean the foreign salts separated in many alumina factories from the concentrated sodium aluminate liquor, which contains, in addition to large quantities of sodium carbonate, fluctuating quantities of vanadium compounds, phosphorous compounds, fluorine compounds, and arsenic compounds. As is known, however, and as has been found again, the average particle size of the primary crystals cannot be increased by increasing the amounts of mineralizers present during calcination. Increases in temperature or the use of other or additional mineralizers either do not influence, or only insignificantly influence the average primary crystal size or the shape of the crystals.

Macrocrystalline alumina whose crystal faces have been formed by natural growth, for example, during the calcination according to U.S. Pat. No. 4,130,402 to Schepers et al, differs from alumina crystals obtained from fused corundum or from sinter alumina by means of mechanical forces, mainly in that the individual particles formed by natural growth have uniform crystal structure. The advantages resulting from uniform crystal structure become apparent when the crystals are used as a grinding agent and when they are employed to produce high quality ceramics.

SUMMARY OF THE INVENTION

It is an object of the present invention to provide macrocrystalline aluminum oxide having a primary particle size greater than 16 microns, and largely greater than 25 microns, and less than or equal to 250 microns.

It is another object of the present invention to provide primary particles of macrocrystalline aluminum oxide which are homogeneous with respect to their crystal shape.

It is another object of the present invention to provide a calcination process which makes it possible to obtain macrocrystalline aluminum oxide of the above-mentioned size and homogeneity, from aluminum hydroxide.

It is a further object of the present invention to provide a calcination process which eliminates the disadvantages of the prior art and simplifies the manufacturing process, thereby reducing costs.

To achieve these objects, and in accordance with its purpose, the present invention provides both monocrystals of aluminum oxide and a method for their production. The monocrystals are hexagonal, laminar, alpha aluminum oxide monocrystals having a grain size of about 16 to about 250 microns, as measured by the diameter of the hexagon, and a ratio of the diameter to the crystal thickness of about 3:1 to 7:1. The monocrystals are produced by a method comprising calcinating aluminum hydroxide of a grain size greater than 60 microns at a temperature greater than 1200° C. but no more than 1450° C., in the presence of at least one fluorine-containing mineralizer compound, and separating the desired grain fraction of the resulting calcinate.

It is to be understood that both the foregoing general description and the following detailed description are exemplary, but are not restrictive of the invention.

DETAILED DESCRIPTION OF THE INVENTION

The starting material in the process of the present invention is aluminum hydroxide having an average particle size greater than 60 microns and preferably from about 70 to about 100 microns. The average particle size of the aluminum hydroxide can also lie above this preferred range, for example, 120μ.

At least one mineralizer compound is added to the starting aluminum hydroxide. Suitable mineralizers for this process are all halides usually used for aluminum hydroxide calcination, such as the fluorine-containing compounds $AlF_3$, $Na_3AlF_6$, $CaF_2$, and HF. Scrapings obtained during the recovery of aluminum metal, and which contain up to 10% of a mixture consisting of $AlF_3$, $Na_3AlF_6$ and LiF, may also be added to furnish the necessary mineralizer. The fluorine-containing mineralizer compound is generally present in an amount of 0.001 to 1.0% by weight of the aluminum oxide.

Preferably, the calcination is effected in the presence of seed crystals, such as $Al_2O_3$ monocrystals. The recycled end product of the process of this invention is present mainly in the form of hexagonal, laminar, aluminum oxide and is suitable for the purpose, as are separately produced $Al_2O_3$ monocrystals. The seed crystals enhances crystal growth, particularly in the direction of the c-axis. Quantities of seed crystals in an amount of about 5 to about 50% by weight with respect to the macrocrystalline aluminum oxide finished product have been found to be suitable, with quantities of about 20% to about 30% by weight being preferred. The recycled end-product is a portion of all the grain sizes. Particular fractions are not necessary.

The use of seed crystals (such as recycle material or separately produced $Al_2O_3$ monocrystals) is not an absolutely necessary feature in the practice of the present invention. As a result of economic considerations, however, it is preferred to use seed material, particularly if the calcination is effected continuously. For continuous operation, for example, in a rotary drum furnace, the seed material is preferably introduced into the calcining assembly simultaneously with the charging material (aluminum hydroxide and mineralizer) so that the mixing takes place within the furnace. The mixing of the charging material with the seed material can of course also be effected before introduction into the furnace, which will be the case, for example, if the furnace is operated in a stationary manner.

The calcination step of the present invention may be carried out in any apparatus generally used for this purpose. Rotating drum furnaces and fluidized bed furnaces are typically used for calcination. The calcination process may be carried out continuously or batchwise.

The calcination temperature in the method of the present invention lies above 1200° C., but is no more than 1450° C., so that the alpha modification of the aluminum oxide with hexagonal monocrystals is formed exclusively or almost exclusively. It should be emphasized that only a small proportion of the monocrystals formed in the process will be present in the form of agglomerates, i.e. about 5-10%. After grinding up these agglomerates, for example in a vibratory mill, the entire calcinate is available in the form of monocrystals having a uniform crystal structure which can be separated into individual fractions having the desired average grain size by means of sifting and/or sorting and/or washing. The grain size desired will depend on the particular field of application.

In a particularly advantageous embodiment of the present invention, the calcination process is effected in a reducing furnace atmosphere. In an unexpected manner, the reducing atmosphere considerably accelerates crystal growth.

One method of producing the reducing furnace atmosphere is to adjust the ratio of fuel to primary and secondary air in the furnace. An adjustment which will result in small quantities of carbon monoxide in the exhaust gas, for example, about 0.2 to 0.5% by volume, will cause sufficient acceleration of crystal growth. Higher concentrations of carbon monoxide in the exhaust gas should generally be avoided in order to save energy and for environmental protection.

The primary air (20-30% of combustion air) is used to atomize and burn partially the fuel, for example oil, and the secondary air is applied to burn the atomized oil. Suitable ratios of fuel to primary and secondary air are, subject to the type of furnaces and type of oil burners and can't described here in terms of numerical ranges. Atomizing oil burners are described in "Chemical Engineers' Handbook" by R. H. Perry, 5.Edition 9-24.

A suitable furnace atmosphere can be determined in a few preliminary experiments, and can then be set in accordance with the remaining process parameters.

In one embodiment of the method of the present invention, the reducing furnace atmosphere can also be produced in the furnace by directly introducing reducing gases, such as, for example CO, HF, or $SO_2$, into the furnace, or can be created in the furnace in situ. Aluminum sulfate, with for example an $Al_2O_3$ content of 17% which decomposes while forming $SO_2$ and $Al_2O_3$, is able to accelerate crystal growth if it is added to the charging material in quantities of 1 to 10 weight percent, particularly 3 to 5% with respect to the finished product. The aluminum sulfate can easily be mixed with the moist charging material by using a measuring device.

Further, other solids, such as carbon or metallic aluminum, can be added to the furnace instead of aluminum sulfate to create a reducing atmosphere in situ. Metallic aluminum is advantageously used in the form of scrapings obtained as waste during the recovery of aluminum metal. Such scrapings, which have been discussed above in connection with their use to furnish mineralizers, contain up to 10% of a mixture consisting of $AlF_3$, $Na_3AlF_6$ and $LiF$, as well as 40% metallic aluminum with the remainder $Al_2O_3$. With the addition of 0.3 to 5% by weight with respect to the monocrystals of ground scrapings, a noticeable increase in crystal growth can be noted.

After calcination, the calcinate is ground in a known manner in a ball or tube mill, with or without sorting in a stream of air. The ground material is transported in a stream of air or by mechanical means, possibly while being sorted simultaneously, and brought to the desired grain size range. Other assemblies, such as vibratory and transverse stream mills can also be used to grind up the small proportion of aggregates obtained during calcination. Vibratory grinding in a grinding drum lined with alumina rocks and employing alumina grinding balls is advisably employed if iron free alumina is desired.

Destruction of primary crystals can be avoided by setting a suitable ratio of grinding element to fill material. For example, if the ratio is 1:2 to 1:6, preferably 1:4 to 1:5, an alumina is obtained which consists exclusively of agglomerate-free laminar primary crystals of a grain size from 16 to 250μ. From this ground material the desired grain fractions according to DIN (German Industrial Standard) standards or FEPA recommendations (Recommendations of Federation Europeene des Fabricants de Produits Abrasifs) can be separated by known processes such as sifting, sorting or washing. When an incorrect ratio of grinding element to fill material is selected, the hexagonal monocrystals are not shattered in the desired manner.

The monocrystals obtained in the process of the present invention are hexagonal wafers having a diameter of about 16 to about 250μ, particularly 26 to about 250μ, and most preferably 40 to 150μ. The ratio of diameter to thickness of the monocrystals is 3:1 to 7:1, preferably 3:1 to 6:1. The diameter is intended to mean the longest connecting line imagined between two opposite corners of the hexagon which in a regular hexagon is equal to the length of each of the two other connecting lines. The ratio of diameter to thickness provides the length ratio of the just defined diameter to the height of the hexagonal prism, i.e. to the distance between the two hexagonal crystal faces.

The fact that the average particle size according to the invention for the starting hydroxide could influence the crystal growth in the calcination process to such a high degree, particularly under the given conditions, was not apparent from the prior art and must be considered to be surprising. It is especially surprising in view of the fact coarsely crystalline aluminum hydroxide (hydrargillite) has been known and calcined for a long time, but always with the formation of a microcrystalline alumina.

The macrocrystalline alumina produced according to the method of the invention consists of at least 99% alpha Al$_2$O$_3$. Compared to the prior art alumina used in the grinding agent industry and in oxide ceramics, which was produced using electrocorundum or tabular alumina in various grain sizes, the novel alumina of the present process is distinguished by the fact that it consists exclusively of laminar, naturally grown and well formed crystals. The sharp edges formed during crystal growth make it particularly suitable for mechanical surface treatments. In addition to the improved abrasive properties, the monocrystals according to the invention also exhibit increased sinter activity so that they are of excellent quality for the oxide ceramic industry.

The present invention thus relates to hexagonal laminar aluminum oxide monocrystals having a diameter of 16 to 250μ, in particular 26 to 250μ, and a ratio of diameter to thickness of 3:1 to 7:1. By way of grinding and sorting and/or sifting, grinding grains can be obtained which meet the FEPA recommendations of 100 to 1200 mesh as well as tabular alumina fine grains of, for example 325 mesh. The hexagonal laminar monocrystals are suitable as lapping, polishing, grinding and blasting agents and for the manufacture of oxide ceramics.

The following example is given by way of illustration to further explain the principles of the invention. This example is merely illustrative and is not to be understood as limiting the scope and underlying principles of the invention in any way. All percentages referred to herein are by weight unless otherwise indicated.

EXAMPLE 1

Filter wet aluminum hydroxide having an average particle diameter of 80μ, and a grain proportion wherein 5% of the grains are less than 32μ and 7% of the grains are greater than 150μ, is heated in a rotary drum furnace at a temperature of about 1350° C. while the following are added: 0.2 weight percent NaAlF$_3$, 3 weight percent aluminum sulfate and 20 weight percent macrocrystalline alumina (finished product). The furnace atmosphere is set so that 0.4 volume percent carbon monoxide remains in the exhaust gas. An equilibrium state in crystal growth occurs after 5 hours. After cooling and grinding the production material in a vibratory mill, the following grain proportions are determined in the macrocrystalline laminar alumina:

| | |
|---|---|
| residue on 200μ screen | 1.5% |
| residue on 150μ screen | 2.2% |
| residue on 120μ screen | 4.0% |
| residue on 100μ screen | 6.5% |
| residue on 90μ screen | 3.0% |
| residue on 60μ screen | 23.3% |
| residue on 50μ screen | 5.0% |
| residue on 40μ screen | 11.0% |
| residue on 32μ screen | 23.0% |
| passed through 32μ screen | 20.5% |

The macrocrystalline alumina produced according to this example contained at least 99% alpha Al$_2$O$_3$.

EXAMPLE 2

Under the above—described conditions but after duplicated time for crystal growth the following grain proportions are determined in the macrocrystalline laminar alumina (before grinding):

| | |
|---|---|
| residue on 150μ screen | 35% |
| residue on 100μ screen | 65% |
| residue on 60μ screen | 100% |

It will be understood that the above description of the present invention is susceptible to various modifications, changes and adapations, and the same are intended to be comprehended within the meaning and range of equivalents of the appended claims.

What is claimed is:

1. Lapping material comprising hexagonal, laminar alpha aluminum oxide monocrystals containing at least 99% alpha Al$_2$O$_3$ and having a grain size of about 16 to 250 microns, as measured by the diameter of the hexagon, and a ratio of said diameter to the crystal thickness of about 3:1 to about 7:1, at least about 40.5% by weight of said monocrystals having a grain size of at least 60 microns.

2. Lapping material comprising hexagonal, laminar alpha aluminum oxide monocrystals containing at least 99% alpha Al$_2$O$_3$, and having a grain size of about 16 to 250 microns, as measured by the diameter of the hexagon, and a ratio of said diameter to the crystal thickness of about 3:1 to about 7:1, at least about 56.5% by weight of said monocrystals having a grain size of at least 40 microns.

3. The material of claim 1 or 2, wherein the monocrystals have a grain size of 26 to about 250 microns.

4. The material of claim 1 or 2, wherein at least about 79.5% by weight of said monocrystals have a grain size of at least 32 microns.

5. Method for producing hexagonal, laminar, alpha aluminum oxide monocrystals having a grain size of about 16 to about 250 microns, as measured by the diameter of the hexagon, and a ratio of said diameter to the crystal thickness of about 3:1 to about 7:1, comprising: calcining aluminum hydroxide of a grain size greater than 60 microns at a temperature greater than 1200° C. but no more than 1450° C., in the presence of at least one fluorine-containing mineralizer compound, and separating a desired grain fraction from the resulting calcinate.

6. Method of claim 5 wherein the aluminum hydroxide has an average particle size of about 70 to 100 microns.

7. Method of claim 5 wherein the calcination is performed in the presence of seed crystals in a quantity of about 5 to about 50% by weight with respect to the monocrystals.

8. Method of claim 7 wherein the seed crystals are present in a quantity of about 20 to about 30% by weight with respect to the monocrystals.

9. Method as defined in claim 7 wherein aluminum oxide monocrystals which are the end product of the present process or are separately produced, are the seed crystals.

10. Method as defined in claim 5, 6, 7, 8 or 9, wherein calcination is effected in a reducing furnace atmosphere.

11. Method as defined in claim 10 wherein the reducing furnace atmosphere is produced by adjusting the ratio of fuel to primary and secondary air.

12. Method as defined in claim 10 wherein the reducting furnace atmosphere is produced in the calcination furnace by the addition of aluminum sulfate in quantities of about 1 to about 10 weight percent with respect to the monocrystals.

13. Method as defined in claim 12 wherein about 3 to about 5 weight percent of aluminum sulfate is added.

14. Method as defined in claim 10 wherein calcination is effected in the presence of scrapings from aluminum metal recovery.

15. Method as defined in claim 14 wherein the scrapings are added in an amount of about 0.3 to about 5 weight percent with respect to the monocrystals.

16. Method as defined in claim 5 wherein the mineralizer compound is present in a quantity of 0.001 to 1% by weight of the aluminum oxide.

* * * * *